United States Patent
Yang et al.

(10) Patent No.: US 12,238,500 B2
(45) Date of Patent: Feb. 25, 2025

(54) SPEAKER WITH BETTER ACOUSTIC PERFORMANCE STRUCTURE

(71) Applicants: AAC Microtech (Changzhou) Co., Ltd., Changzhou (CN); AAC ACOUSTIC TECHNOLOGIES (SHENZHEN) CO., LTD., Shenzhen (CN)

(72) Inventors: Huhu Yang, Shenzhen (CN); Wei Wei, Shenzhen (CN); Zhaoyu Yin, Shenzhen (CN); Zhizhu Chen, Shenzhen (CN)

(73) Assignees: AAC Microtech (Changzhou) Co., Ltd., Changzhou (CN); AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 351 days.

(21) Appl. No.: 17/981,494

(22) Filed: Nov. 7, 2022

(65) Prior Publication Data
US 2023/0328450 A1    Oct. 12, 2023

(30) Foreign Application Priority Data
Apr. 6, 2022   (CN) .......................... 202220783975.6

(51) Int. Cl.
*H04R 9/06* (2006.01)
*H04R 1/06* (2006.01)
*H04R 3/00* (2006.01)
*H04R 7/12* (2006.01)
*H04R 7/18* (2006.01)
*H04R 9/02* (2006.01)

(52) U.S. Cl.
CPC ................. *H04R 9/06* (2013.01); *H04R 1/06* (2013.01); *H04R 3/00* (2013.01); *H04R 7/127* (2013.01); *H04R 7/18* (2013.01); *H04R 9/025* (2013.01); *H04R 2400/11* (2013.01)

(58) Field of Classification Search
CPC ... H04R 9/06; H04R 1/06; H04R 3/00; H04R 7/127; H04R 7/18; H04R 9/025; H04R 2400/11
USPC ........................................................ 381/117
See application file for complete search history.

(56) References Cited

U.S. PATENT DOCUMENTS

2018/0027335 A1* 1/2018 Li et al. ................... H04R 9/06

* cited by examiner

*Primary Examiner* — Vivian C Chin
*Assistant Examiner* — Jessica W. Tai
(74) *Attorney, Agent, or Firm* — W&G Law Group

(57) ABSTRACT

A speaker includes: a frame, a vibration system, including a diaphragm, a voice coil, and a flexible circuit board, and a magnetic circuit system, wherein the voice coil includes a first lead wire and a second lead wire, the flexible circuit board includes a first surface facing the diaphragm and a second surface opposite to the first surface, the first lead wire and the first surface are located at one side of the flexible circuit board, the second lead wire and the second surface are located at another side of the flexible circuit board, the flexible circuit board includes a first pad on the first surface and a second pad on the second surface, the first lead wire is connected to the first pad, the second lead wire is connected to the second pad. Compared with the related art, the speaker disclosed by the present disclosure has better acoustic performance.

7 Claims, 4 Drawing Sheets

SPEAKER WITH BETTER ACOUSTIC PERFORMANCE STRUCTURE

TECHNICAL FIELD

The present disclosure relates to an electro-acoustic device, in particular to a speaker used in portable electronic products.

BACKGROUND

A related speaker mainly includes a frame, a vibration system fixed to the frame, and a magnetic circuit system with a magnetic gap for driving the vibration system to vibrate and emit sounds.

The vibration system includes a diaphragm fixed to the frame, a voice coil located in the magnetic gap and driving the diaphragm to vibrate and emit sounds, and a flexible circuit board fixed to the frame and electrically connected to the voice coil. Pads on the flexible circuit board all face the diaphragm, the voice coil includes a first lead wire and a second lead wire, which are respectively the incoming and outgoing wires of the voice coil. The first lead wire and the second lead wire are respectively located at two opposite sides of the flexible circuit board. Therefore, the first lead wire is directly electrically connected to one pad on the flexible circuit board, and the second lead wire has to turn over and pass through a gap between the voice coil and the flexible circuit board, and then connect with another pad.

The consistency of the gap between the voice coil and the flexible circuit board of the speaker with this structure cannot be controlled, and the voice coil will push the pads outward, resulting in a risk of the separation of the voice coil and the flexible circuit board. In addition, an extra space for the voice coil lead wire to tune over is needed, which will occupy the internal space of the speaker and affect the acoustic performance of the speaker.

Therefore, it is a need to provide an improved speaker to solve the above problems.

SUMMARY

In view of the above, an objective of the present disclosure is to provide a speaker with better acoustic performance.

In order to achieve the objective mentioned above, the present disclosure discloses a speaker including: a frame, a vibration system fixed to the frame, including a diaphragm fixed to the frame, a voice coil, and a flexible circuit board fixed to the frame and electrically connected with the voice coil, and a magnetic circuit system for driving the vibration system to vibrate and emit sounds, fixed to the frame and including a magnetic gap, wherein the voice coil is located in the magnetic gap and includes a first lead wire and a second lead wire, the first lead wire and the second lead wire are respectively located at two opposite sides of the flexible circuit board, the flexible circuit board includes a first surface facing the diaphragm and a second surface opposite to the first surface, the first lead wire and the first surface are located at one side of the flexible circuit board, the second lead wire and the second surface are located at another side of the flexible circuit board, the flexible circuit board further includes a first pad on the first surface and a second pad on the second surface, the first lead wire is connected to the first pad, and the second lead wire is connected to the second pad.

As an improvement, an amount of the flexible circuit boards is four, the four flexible circuit boards are respectively arranged at four corners of the frame, the first pad and the second pad are arranged on different flexible circuit boards.

As an improvement, the magnetic circuit system includes a yoke, and a main magnet and a plurality of secondary magnets located on the yoke, the plurality of secondary magnets is located around the main magnet and forms the magnetic gap with the main magnet, a plurality of receiving spaces for receiving the flexible circuit boards is formed between adjacent secondary magnets.

As an improvement, the magnetic circuit system further includes a main pole plate located on the main magnet and a secondary pole plate located on the plurality of secondary magnets, the secondary pole plate is provided with a plurality of avoiding spaces respectively corresponding to the plurality of receiving spaces, and a projection of each flexible circuit board along the vibration direction of the diaphragm is at least partially located in a corresponding one of the avoiding spaces.

As an improvement, the secondary pole plate is a hollow annular structure, and the avoiding spaces are arranged at corners of the secondary pole plate.

As an improvement, in the flexible circuit board includes a first fixing arm fixed to the frame, a second fixing arm spaced from the first fixing arm, and an elastic connecting arm connecting the first fixing arm and the second fixing arm, the first pad and the second pad are arranged on the second fixing arm.

As an improvement, the frame includes a plurality of receiving grooves for accommodating the first fixing arms, and each first fixing arm is fixed in a corresponding one of the receiving grooves.

DESCRIPTION OF EMBODIMENTS

The technical solutions in embodiments of the present disclosure will be described clearly and completely below with reference to the accompanying drawings in the embodiments of the present disclosure.

Figure 1:
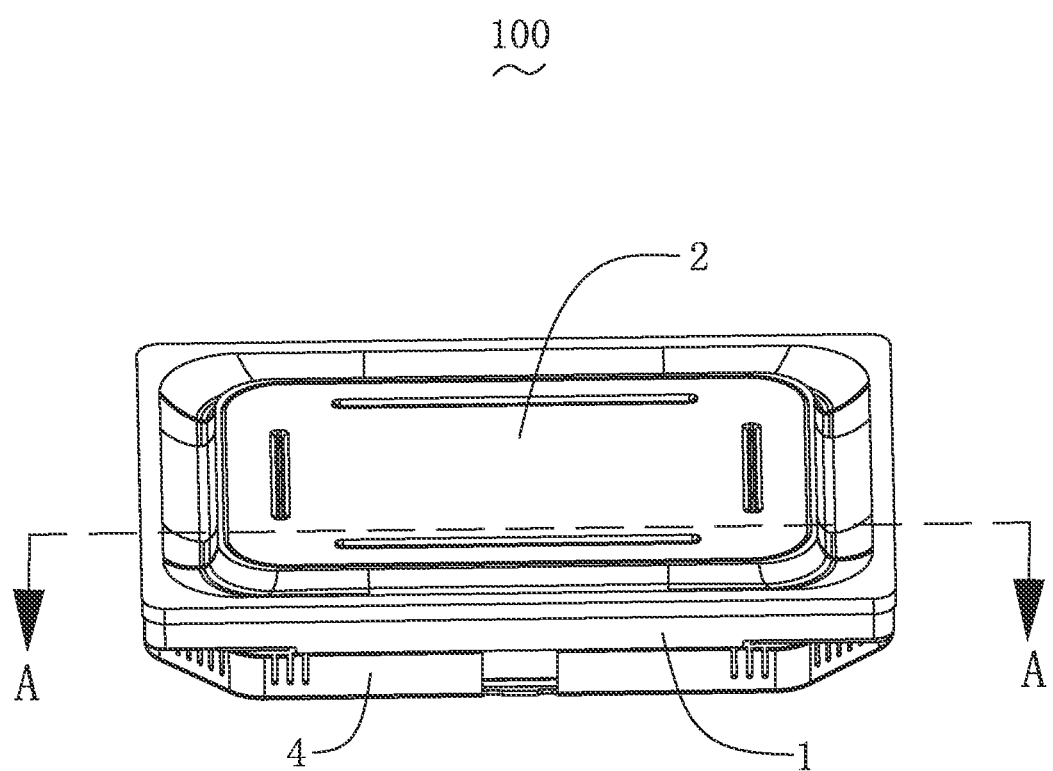
FIG. 1 is an isometric view of a speaker in accordance with an exemplary embodiment of the present disclosure.
Figure 2:
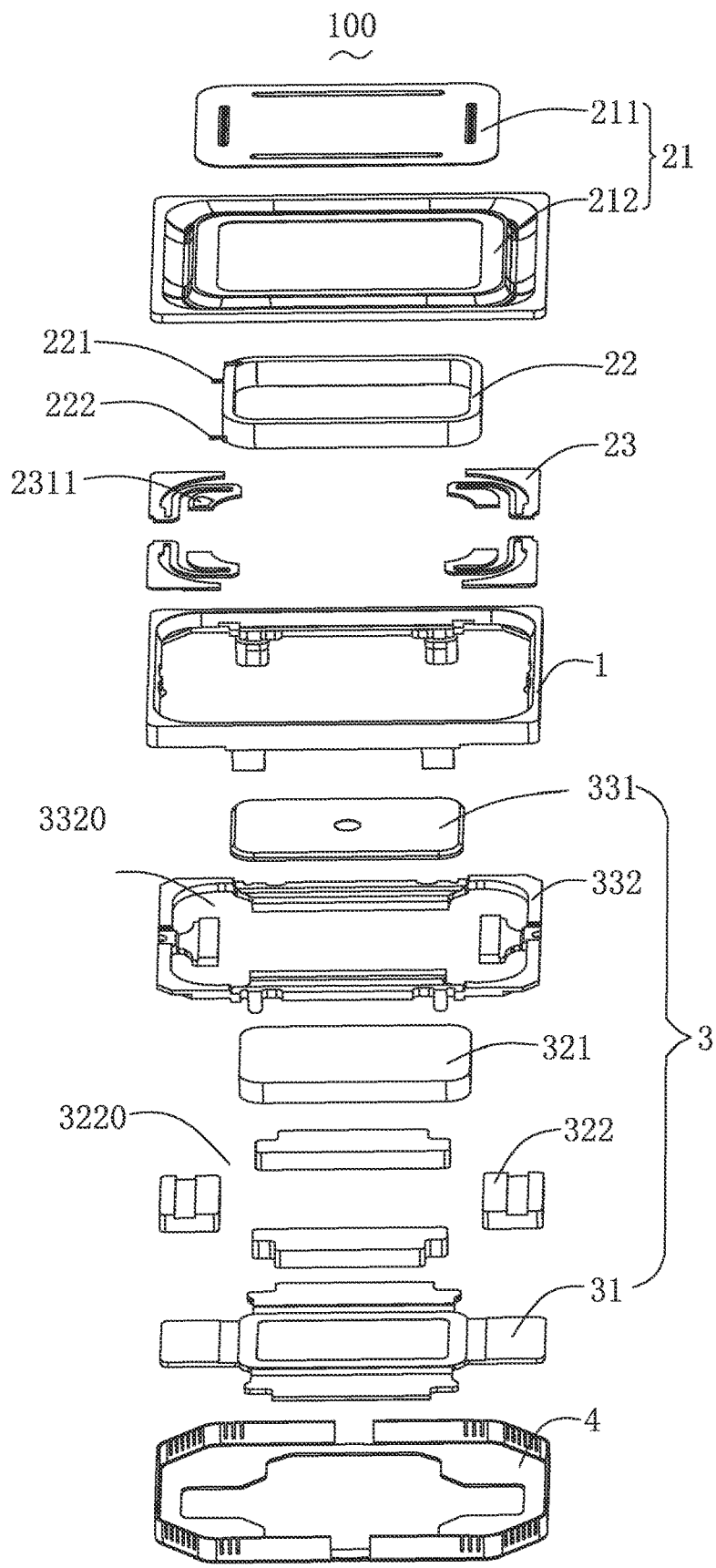
FIG. 2 is an exploded view of the speaker in FIG. 1.
Figure 3:
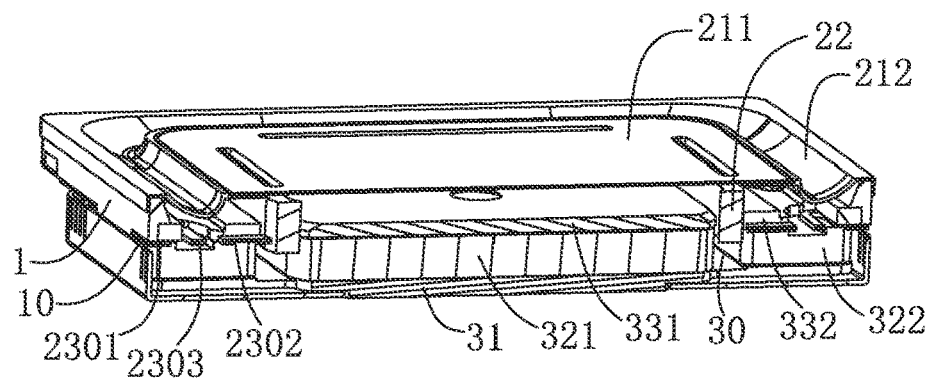
FIG. 3 is a cross-sectional view of the speaker taken along line A-A in FIG. 1.
Figure 4:
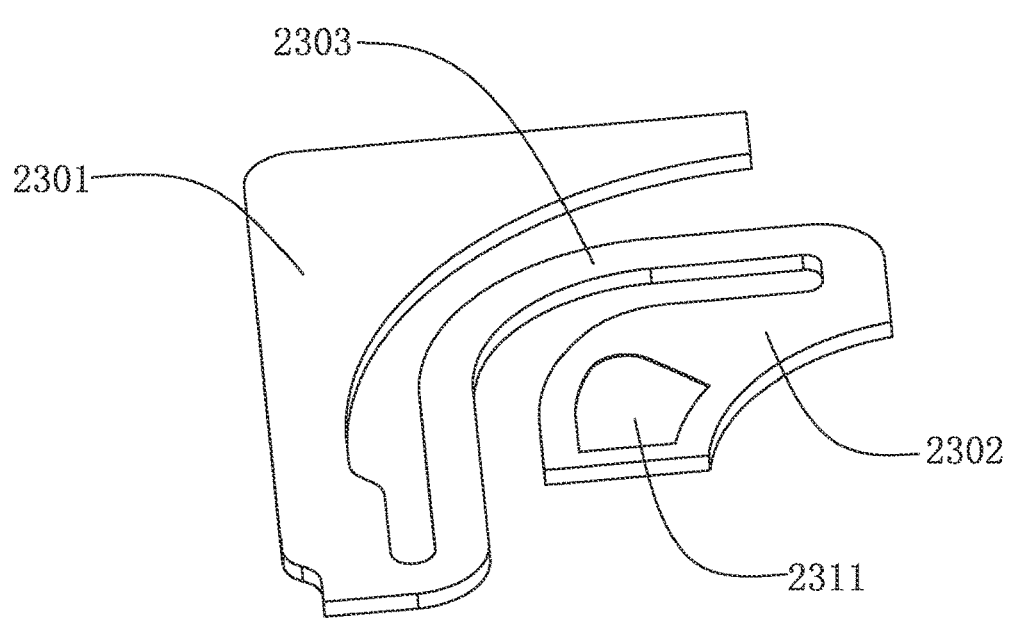
FIG. 4 is an isometric view of a flexible circuit board in the speaker in accordance with an exemplary embodiment of the present disclosure.
Figure 5:
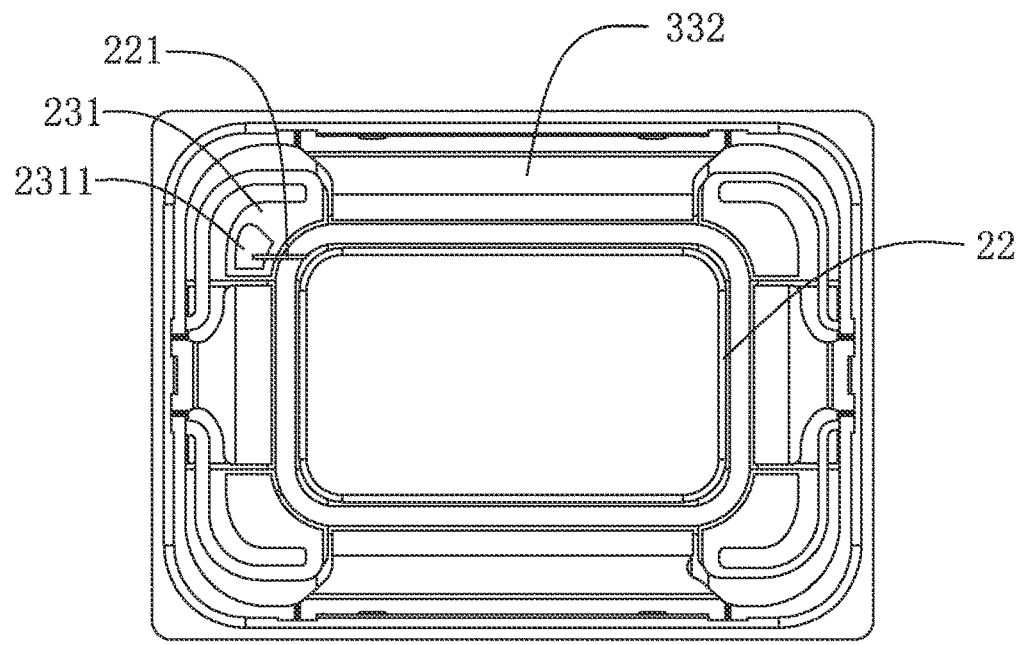
FIG. 5 is a schematic view of a partial assembly of the speaker in accordance with an exemplary embodiment of the present disclosure.
Figure 6:
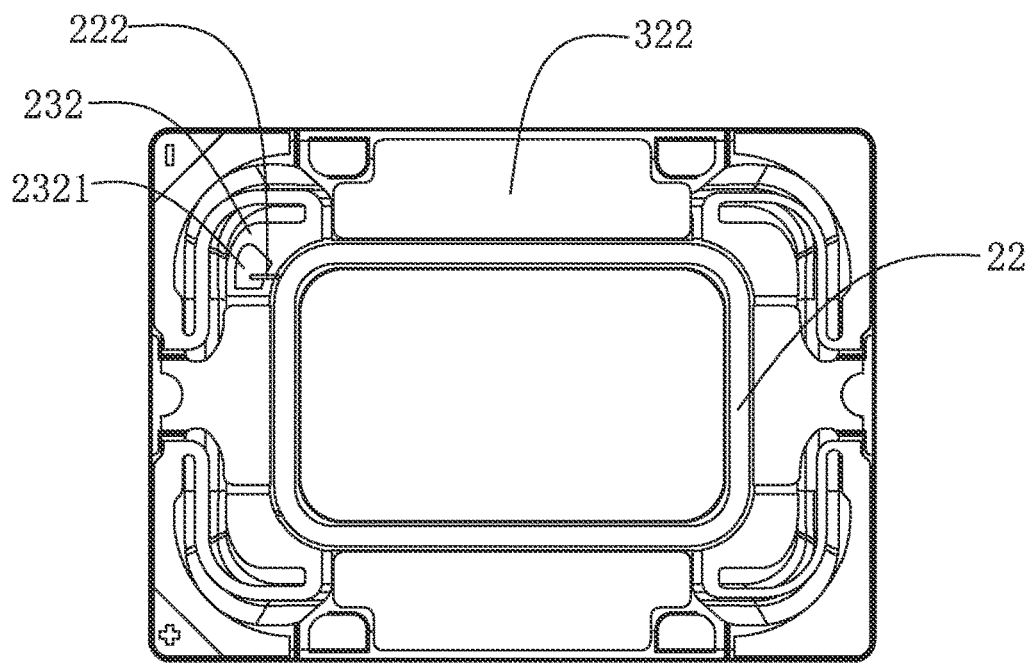
FIG. 6 is a schematic view of another partial assembly of the speaker in accordance with an exemplary embodiment of the present disclosure.

As shown in FIGS. 1-6, the present disclosure discloses a speaker 100. The speaker 100 includes a frame 1, a vibration system 2 fixed to the frame 1, and a magnetic circuit system 3 for driving the vibration system 2 to vibrate and emit sounds, the magnetic circuit system 3 includes a magnetic gap 30.

The vibration system 2 includes a diaphragm 21 fixed to the frame 1, a voice coil 22 located in the magnetic gap 30 and driving the diaphragm 21 to vibrate and emit sounds, and a flexible circuit board 23 fixed to the frame 1. The flexible circuit board 23 is electrically connected with the voice coil 22.

Optionally, the diaphragm 21 further includes a dome 211 in a center thereof and a suspension 212 connected with the dome 211.

The voice coil 22 includes a first lead wire 221 and a second lead wire 222. Optionally, if the first lead wire 221 is an incoming wire of the voice coil 22, the second lead wire 222 is an outgoing wire of the voice coil 22; if the first lead wire 221 is an outgoing wire of the voice coil 22, the second lead wire 222 is an incoming wire of the voice coil 22. That is, one of the first lead wire 221 and the second lead wire 222 is an incoming wire and the other is an outgoing wire. The flexible circuit board 23 includes a first surface 231 facing the diaphragm 21 and a second surface 232 opposite to the first surface 231, the first lead wire 221 and the second lead wire 222 are respectively located on both sides of the flexible circuit board 23, the first lead wire 221 and the first surface 231 are located on one side of the flexible circuit board 23, and the second lead wire 222 and the second surface 232 are located on the other side of the flexible circuit board 23. Further, the first lead wire 221 and the first surface 231 located on the side close to the diaphragm 21, the second lead wire 222 and the second surface 232 are located on the side far away from the diaphragm 21. The flexible circuit board 23 includes a first pad 2311 arranged on the first surface 231 and a second pad 2321 arranged on the second surface 232, the first lead wire 221 is electrically connected to the first pad 2311, the second lead wire 222 is electrically connected to the second pad 2321. Therefore, the voice coil lead wires can be directly electrically connected to the flexible circuit board 23, thereby avoiding the voice coil lead wire turning over, improving the consistency of the relative positions of the voice coil 22 and the flexible circuit board 23, saving the space for the voice coil lead wire to turn over, and improving the acoustic performance of the product.

An amount of the flexible circuit boards 23 is four, the four flexible circuit boards 23 are respectively arranged at four corners of the frame 1. Each flexible circuit board 23 includes a first fixing arm 2301, a second fixing arm 2302 spaced from the first fixing arm 2301, and an elastic connecting arm 2303 connecting the first fixing arm 2301 and the second fixing arm 2302, the first pad 2311 and the second pad 2321 are arranged on the second elastic fixing arm 2302.

Optionally, the magnetic circuit system 3 includes a yoke 31, a main magnet 321 and a plurality of secondary magnets 322 located on the yoke 31, a main pole plate 331 located on the main magnet 321, and a secondary pole plate 332 located on the plurality of secondary magnets 322. The plurality of secondary magnets 322 is located around the main magnet 321 and forms the magnetic gap 30 with the main magnet 321. An amount of the secondary magnets 322 is four, the four secondary magnets 322 are arranged around the main magnet 321, each two of the four secondary magnets are opposite to each other, a plurality of receiving spaces 3220 for receiving the flexible circuit boards 23 is formed between adjacent secondary magnets 322. The secondary pole plate 332 is a hollow annular structure, the secondary pole plate 332 is provided with a plurality of avoiding spaces 3320 arranged at corners of the secondary pole plate 332 and respectively corresponding to the plurality of receiving spaces 3220, and a projection of each flexible circuit board 23 along the vibration direction of the diaphragm 21 is at least partially located in a corresponding one of the avoiding spaces 3320. The plurality of avoiding spaces 3320 of the secondary pole plate 332 provides vibration spaces for the elastic connecting arm 2303 of each flexible circuit board 23.

In addition, the frame 1 includes a plurality of receiving grooves 10 for accommodating the first fixing arms 2301. The receiving grooves 10 are recessed along the direction of the diaphragm 21, and each first fixing arm 2301 is accommodated and fixed in a corresponding one of the receiving grooves 10.

Compared with the related art, the first pad 2311 and the second pad 2312 of the speaker 100 are respectively located on both sides of the flexible circuit board 23, and the first lead wire 221 and the second lead wire 222 of the voice coil 22 are respectively electrically connected with the first pad 2311 and the second pad 2312, thereby avoiding the voice coil lead wire turning over, improving the consistency of the relative position of the voice coil 22 and the flexible circuit board 23, saving the space for the voice coil lead wire to turn over, and improving the acoustic performance of the product.

The above descriptions are merely some of the embodiments of the present disclosure. It should be pointed out that for those of ordinary skill in the art, improvements can be made without departing from the inventive concept of the present disclosure, shall fall within the scope of the present disclosure.

What is claimed is:

1. A speaker, comprising:
a frame,
a vibration system fixed to the frame, comprising a diaphragm fixed to the frame, a voice coil, and a flexible circuit board fixed to the frame and electrically connected with the voice coil, and
a magnetic circuit system for driving the vibration system to vibrate and emit sounds, fixed to the frame and comprising a magnetic gap, wherein
the voice coil is located in the magnetic gap and comprises a first lead wire and a second lead wire, the first lead wire and the second lead wire are respectively located at two opposite sides of the flexible circuit board, the flexible circuit board comprises a first surface facing the diaphragm and a second surface opposite to the first surface, the first lead wire and the first surface are located at one side of the flexible circuit board, the second lead wire and the second surface are located at another side of the flexible circuit board, the flexible circuit board further comprises a first pad on the first surface and a second pad on the second surface, the first lead wire is connected to the first pad, and the second lead wire is connected to the second pad.

2. The speaker described as claim 1, wherein the flexible circuit board contains four flexible circuit board sections, the four flexible circuit board sections are respectively arranged at four corners of the frame, the first pad and the second pad are arranged on different corners of the frame.

3. The speaker described as claim 2, wherein the magnetic circuit system comprises a yoke, and a main magnet and a plurality of secondary magnets located on the yoke, the plurality of secondary magnets is located around the main magnet and forms the magnetic gap with the main magnet, a plurality of receiving spaces for receiving the flexible circuit board sections is formed between adjacent secondary magnets.

4. The speaker described as claim 3, wherein the magnetic circuit system further comprises a main pole plate located on the main magnet and a secondary pole plate located on the plurality of secondary magnets, the secondary pole plate is provided with a plurality of avoiding spaces respectively corresponding to the plurality of receiving spaces, and a projection of each flexible circuit board along the vibration direction of the diaphragm is at least partially located in a corresponding one of the avoiding spaces.

5. The speaker described as claim 4, wherein the secondary pole plate is a hollow annular structure, and the avoiding spaces are arranged at corners of the secondary pole plate.

6. The speaker described as claim 1, wherein the flexible circuit board comprises a first fixing arm fixed to the frame, a second fixing arm spaced from the first fixing arm, and an elastic connecting arm connecting the first fixing arm and the second fixing arm, the first pad and the second pad are arranged on the second fixing arm.

7. The speaker described as claim 6, wherein the frame comprises a plurality of receiving grooves for accommodating the first fixing arms, and each first fixing arm is fixed in corresponding one of the receiving grooves.

* * * * *